(12) United States Patent
Okano et al.

(10) Patent No.: US 6,894,515 B2
(45) Date of Patent: May 17, 2005

(54) INSPECTION UNIT AND METHOD OF MANUFACTURING SUBSTRATE

(75) Inventors: Koji Okano, Fukuyama (JP); Shogo Ishioka, Fukayasu-gun (JP)

(73) Assignee: OHT, Inc., Fukayasu-gun (JP)

( * ) Notice: Subject to any disclaimer, the term of this patent is extended or adjusted under 35 U.S.C. 154(b) by 44 days.

(21) Appl. No.: 10/130,279

(22) PCT Filed: Sep. 25, 2001

(86) PCT No.: PCT/JP01/08291

§ 371 (c)(1),
(2), (4) Date: May 28, 2002

PCT Pub. Date: Mar. 28, 2002

(65) Prior Publication Data

US 2002/0180454 A1 Dec. 5, 2002

(30) Foreign Application Priority Data

Sep. 25, 2000 (JP) .......................................... 2000-290543

(51) Int. Cl.⁷ .............................................. G01R 31/02
(52) U.S. Cl. ....................................................... 324/754
(58) Field of Search ................................ 324/754, 537, 324/758, 763

(56) References Cited

U.S. PATENT DOCUMENTS

| | | | | |
|---|---|---|---|---|
| 5,225,777 A | * | 7/1993 | Bross et al. ................. | 324/754 |
| 5,426,372 A | | 6/1995 | Freve | |
| 5,631,572 A | * | 5/1997 | Sheen et al. ................. | 324/754 |
| 6,097,203 A | * | 8/2000 | Parker et al. ................ | 324/763 |
| 6,353,327 B2 | * | 3/2002 | Nishikawa ................... | 324/758 |
| 6,630,832 B1 | * | 10/2003 | Harzanu et al. ............. | 324/537 |

FOREIGN PATENT DOCUMENTS

| | | |
|---|---|---|
| JP | 5-60789 | 3/1993 |
| JP | 5-188085 | 7/1993 |
| JP | 7-167906 | 7/1995 |
| JP | 10-282179 | 10/1998 |
| JP | 2000-91391 | 3/2000 |
| JP | 2000-100495 | 4/2000 |
| JP | 2000-227441 | 8/2000 |

* cited by examiner

Primary Examiner—N. Le
Assistant Examiner—Amy He
(74) Attorney, Agent, or Firm—Westerman, Hattori, Daniels & Adrian, LLP

(57) ABSTRACT

The present invention provides an inspection unit capable of allowing a probe and other components to be positioned with a high degree of accuracy while preventing misalignment of the probe and to be arranged closer to each other. The inspection unit includes a probe 14a for supplying an inspection signal in contact with a circuit wiring, and a board 12 having an electrode 13 printed thereon to detect the supplied inspection signal to the circuit wiring in non-contact with the circuit wiring. The board 12 includes a bore 12a allowing the probe 14a to be penetratingly disposed therein. The bore 12a is adapted to guide the axial movement of the probe 14a. A circuit wiring having branch portions branched halfway therefrom can be inspected by using a less number of non-contact sensors.

11 Claims, 11 Drawing Sheets (a)

(b)

(a)

(b)

INSPECTION UNIT AND METHOD OF MANUFACTURING SUBSTRATE

TECHNICAL FIELD

The present invention relates to an inspection unit for use in inspection of a circuit wiring, and associated technologies thereof.

BACKGROUND ART

For the purpose of inspecting a disconnection, short-circuit or the like in a circuit wiring (conductive pattern) formed on a circuit board, there has been employed a method including the steps of supplying an inspection signal to the circuit wiring, detecting the inspection signal at the end or another suitable position of the circuit wiring, optionally subjecting the detected signal to a suitable signal processing, and analyzing the detected signal.

The techniques for supplying an inspection signal to or detecting it from a circuit wiring may be broadly classified into a contact type in which the supply, detection or another process of the inspection signal is carried out in contact with the circuit wiring, and a non-contact type in which such a process is carried out in non-contact with the circuit wiring.

The contact type inspection has been widely known in which a probe composed of a conductive member such as a pin-shaped member is brought into contact with a circuit wiring to supply or detect an inspection signal through the probe.

On the other hand, the non-contact type inspection may be broadly classified into one type in which an inspection signal supplied to a circuit wiring is detected through a capacitive coupling between the circuit wiring and a sensor electrode, and the other type in which an electromagnetic field caused by an inspection signal supplied to a circuit wiring is detected.

With reference to FIG. 8, a principle of the former inspection based on the capacitive coupling will be described. FIG. 8(a) illustrates the principle of the inspection based on the capacitive coupling.

An inspection signal is supplied from a signal source 102 to one of the ends of a circuit wiring 100 to be inspected. Further, an electrode 101 is arranged in non-contact with the circuit wiring 100 at the other end of the circuit wiring 100. The signal source 102 is operable to generate an AC signal serving as the inspection signal and supply the generated signal to the one end of the circuit wiring 100 to be inspected. For the inspection signal, a temporally varied signal (e.g. a signal having a frequency in voltage variation ranging from about 1 kHz to about 10 MHz) is employed. As a substitute for the AC signal, a pulsed signal may be used.

In the illustrated structure, the electrode 101 and the other end of the circuit wiring 100 are capacitively coupled with each other to define a capacitor. Specifically, an equivalent circuit of FIG. 8(a) may be represented by FIG. 8(b). If the circuit wiring 100 has no disconnection, the electrode 101 can detect a signal caused thereat in response to an inspection signal supplied from the signal source 102 to the circuit wiring 100. Conversely, if the circuit wiring 100 has a disconnection, almost no signal will appear at the electrode 101. In this manner, the presence of disconnection in the circuit wiring 100 can be determined.

The aforementioned electrode 101 is exclusively used to detect the inspection signal. However, according to the same principle, if the signal source 102 is connected to the electrode 101, the electrode 101 is operable to supply an inspection signal to the circuit wiring 100. That is, the electrode 101 can be used not only to detect the inspection signal but also to supply it.

This inspection technique is advantageous in that the circuit wiring is seldom damaged because the electrode is in non-contact with the circuit wiring, and such an inspection technique has wide applicability to various circuit wirings including fine-pitch circuit wirings.

With reference to FIGS. 9 and 10, a principle of the inspection based on the detection of an electromagnetic field will be described below. FIGS. 9 and 10 illustrate the principle of this inspection.

The inspection based on the detection of an electromagnetic field is generally employed when the ends of circuit wirings to be inspected are connected with a short-circuiting wiring referred to as a short-circuiting bar. In FIG. 9, the ends of circuit wirings 112 to be inspected are connected with a short-circuiting wiring 111.

As shown in FIG. 9, when a certain potential is applied between a pair of adjacent circuit wirings 112, a current 113 will flow through these circuit wirings 112 and the short-circuiting wiring 111. As a result of the current 113, an electromagnetic field 114 is generated within the horseshoe-shaped region surrounded by these circuit wirings 112 and the short-circuiting wiring 111.

By detecting this electromagnetic field 114 with a magnetometric sensor composed of a coil, a hall element or the like, a defect in the pair of circuit wirings 112 applied with the potential difference can be determined. More specifically, for example, if there is a defect that the pair of the circuit wirings 112 are short-circuited by a line 115 as shown in FIG. 10, currents 113a and 113b will be caused because a part of the current 113 in FIG. 9 flows into the line 115, and correspondingly electromagnetic fields 114a and 114b will be generated.

Comparing the electromagnetic field 114a or 114b of FIG. 10 having the defect in the circuit wirings with the normal electromagnetic field 114 of FIG. 9, the former electromagnetic field has lower intensity because it is generated by the smaller current 113a or 113b. Thus, the presence of the defect in the circuit wirings can be determined by detecting the intensity, distribution or the like of the electromagnetic field within the region approximately surrounded by the pair of circuit wirings 112 to be inspected and the short-circuiting wiring 111.

As above, various techniques are proposed to inspect a circuit wiring, and each of the inspection techniques can be selectively applied depending on the specification of a circuit wiring to be inspected.

Further, for actually carrying out these inspection methods, an inspection unit referred to as a jig is used. The inspection unit includes a probe, electrode or the like arranged in conformity with a circuit wiring to be inspected. When a plurality of inspection methods are combinedly carried out, an inspection unit provided with a necessary probe, electrode and others will be used. FIG. 7(a) is a schematic diagram of a conventional inspection unit 200 including a probe for the contact type inspection, and an electrode for the inspection based on the capacitive coupling in the non-contact type inspection.

The inspection unit 200 comprises a baseboard 201, a reinforcing plate 202 laminated on the baseboard 201, a plurality of probe portions 203 each protruding from the surface of the reinforcing plate 202, and an electrode portion 204 provided on the reinforcing plate 202. A circuit board to be inspected is mounted on a platform 206, and each of locating pins 205 of the inspection unit 200 will be inserted into a corresponding one of holes of the circuit board and the platform 206 to place the inspection unit 200 on the circuit board.

FIG. 7(b) is a sectional view showing the structure of the inspection unit 200 around the probe portion 203. The probe portion 203 includes a probe body 203a, a sleeve 203b housing the rear end of the probe body 203a, and a spring 203c elastically biasing the probe body 203a in the axial direction of the probe body.

The sleeve 203b is fixedly attached to the baseboard 201. The probe body 203a is supported by the sleeve 203b through the spring 203 in a suspended manner, and is movable in the axial direction of the probe body 203a. Thus, when the inspection unit 200 is slightly pressed against the circuit board and placed thereon, the spring 203c biases the probe body 203a to allow the front end of the probe body to be reliably brought into contact with the circuit wiring.

The reinforcing plate 202 is composed of a plate member made by bakelite or the like, and is formed with a bore 202a for guiding the axial movement of the probe body 203a. This bore 202a is intended to support the probe body 203a with preventing undesirable misalignment caused when the probe body 203a is moved in its axial direction with being biased by the spring 203c. For this purpose, the bore 202a has a diameter slightly larger than that of the probe body 203a.

FIG. 7(c) is a sectional view showing the structure of the inspection unit 200 around the electrode portion 204, particularly showing the structure around the electrode portion 204 which is arranged close to the probe portion 203.

The electrode portion 204 includes an electrode 204a composed of a copper thin film or the like, and a substrate 204b having the electrode 204a formed on the surface thereof. The electrode portion 204 is mounted on a hollowed portion of the reinforcing plate 202 with an adhesive, screw or the like.

However, due to the structure of the conventional inspection unit 200 in which the electrode portion 204 is mounted on the reinforcing plate 202, it has been difficult to assure a sufficient positioning accuracy between the probe portion 203 and the electrode portion 204.

Further, when the probe body 203a is arranged close to the electrode portion 204, or the probe body 203a is arranged to penetrate the electrode portion 204, as shown in FIG. 7(c), there is the case that the misalignment of the probe body 203a cannot be sufficiently prevented because the thickness of the bore 202a in the reinforcing plate 202 becomes thin due to the hollowed portion of the reinforcing plate 202 around the probe body 203a. In addtion, for machining the hollowed portion, it is necessary to assure a certain distance between the electrode 204a and the probe body 203a. This has set a limit to arrange the electrode 204a close to the probe body 203.

It is therefore an object of the present invention to provide an inspection unit and a method of manufacturing a board constituting such an inspection unit, capable of allowing a probe and other components to be positioned with a high degree of accuracy while preventing undesirable misalignment of the probe and to be arranged closer to each other.

DISCLOSURE OF INVENTION

According to one aspect of the present invention, there is provided an inspection unit for use in inspection of a circuit wiring, comprising a probe for supplying an inspection signal in contact with the circuit wiring, and a board having an electrode printed thereon to detect the supplied inspection signal to the circuit wiring in non-contact with the circuit wiring. Further, the board includes a bore allowing the probe to be penetratingly disposed therein. The bore is adapted to guide the axial movement of the probe.

According to another aspect of the present invention, there is provided an inspection unit for use in inspection of a circuit wiring, comprising a probe for supplying or detecting an inspection signal in contact with the circuit wiring, and a board having an electrode printed thereon to supply or detect an inspection signal in non-contact with the circuit wiring. Further, the board includes a bore allowing the probe to be penetratingly disposed therein. The bore is adapted to guide the axial movement of the probe.

According to another aspect of the present invention, there is provided an inspection unit for use in inspection of a circuit wiring, comprising a probe for supplying an inspection signal in contact with the circuit wiring, and a board having a spiral-shaped conductive pattern printed thereon to detect an electromagnetic field caused by the supplied inspection signal to the circuit wiring. Further, the board includes a bore allowing the probe to be penetratingly disposed therein. The bore is adapted to guide the axial movement of the probe.

According to another aspect of the present invention, there is provided an inspection unit for use in inspection of a circuit wiring, comprising a probe for supplying an inspection signal in contact with the circuit wiring, a board having an electrode printed thereon to detect the supplied inspection signal to the circuit wiring in non-contact with the circuit wiring, and a magnetometric sensor provided on the board to detect an electromagnetic field caused by the supplied inspection signal to the circuit wiring. Further, the board includes a bore allowing the probe to be penetratingly disposed therein. The bore is adapted to guide the axial movement of the probe.

According to another aspect of the present invention, there is provided a method for manufacturing a board constituting an inspection unit for use in inspection of a circuit wiring, comprising the steps of printing on a substrate an electrode for supplying or detecting an inspection signal in non-contact with the circuit wiring, and forming in the substrate a bore for receiving therethrough a probe for supplying or detecting an inspection signal in contact with the circuit wiring. The bore is adapted to guide the axial movement of the probe.

According to another aspect of the present invention, there is provided a method for manufacturing a board constituting an inspection unit for use in inspection of a circuit wiring, comprising the steps of printing on a substrate a spiral-shaped conductive pattern for detecting an electromagnetic field caused by an inspection signal supplied to the circuit wiring, and forming in the substrate a bore for receiving therethrough a probe for supplying the inspection signal in contact with the circuit wiring. The bore is adapted to guide the axial movement of the probe.

According to another aspect of the present invention, there is provided a method for manufacturing a board constituting an inspection unit for use in inspection of a circuit wiring, comprising the steps of printing on a substrate an electrode for detecting an inspection signal in non-contact with the circuit wiring, and forming in the substrate a bore for receiving therethrough a probe for supplying the inspection signal in contact with the circuit wiring. The bore is adapted to guide the axial movement of the probe. This method further includes the step of forming in the substrate a hole for mounting therein a magnetometric sensor for detecting an electromagnetic field caused by the supplied inspection signal to the circuit wiring.

BRIEF DESCRIPTION OF DRAWINGS

FIGS. 6(a) to 6(c) are explanatory views of the process for manufacturing a printed board including an electrode 13 and a board 12 having a bore 12a;

FIG. 7 illustrates a conventional inspection unit 200, wherein FIG. 7(a) is a schematic diagram of the inspection unit 200, FIG. 7(b) being a sectional view showing the structure of the inspection unit 200 around a probe portion 203, and FIG. 7(c) being a sectional view showing the structure of the inspection unit 200 around an electrode portion 204;

BEST MODE FOR CARRYING OUT THE INVENTION

Figure 1:
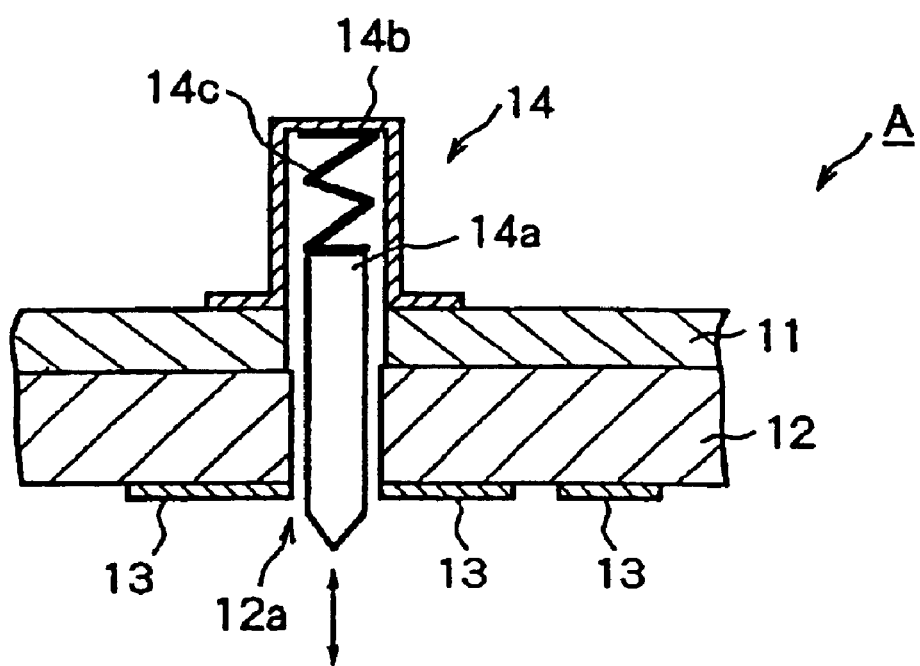
FIG. 1 is a sectional view of an inspection unit A according to one embodiment of the present invention.
Figure 7:
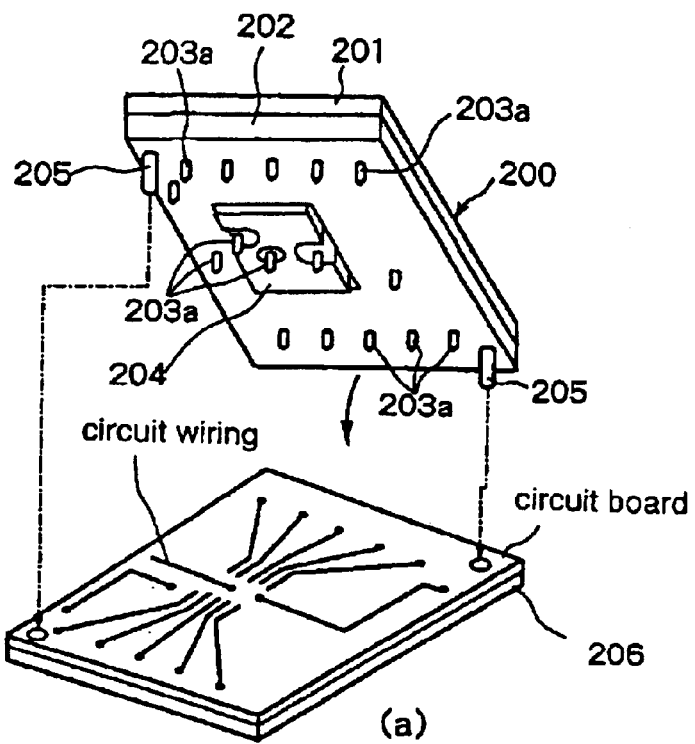
Figure 7:
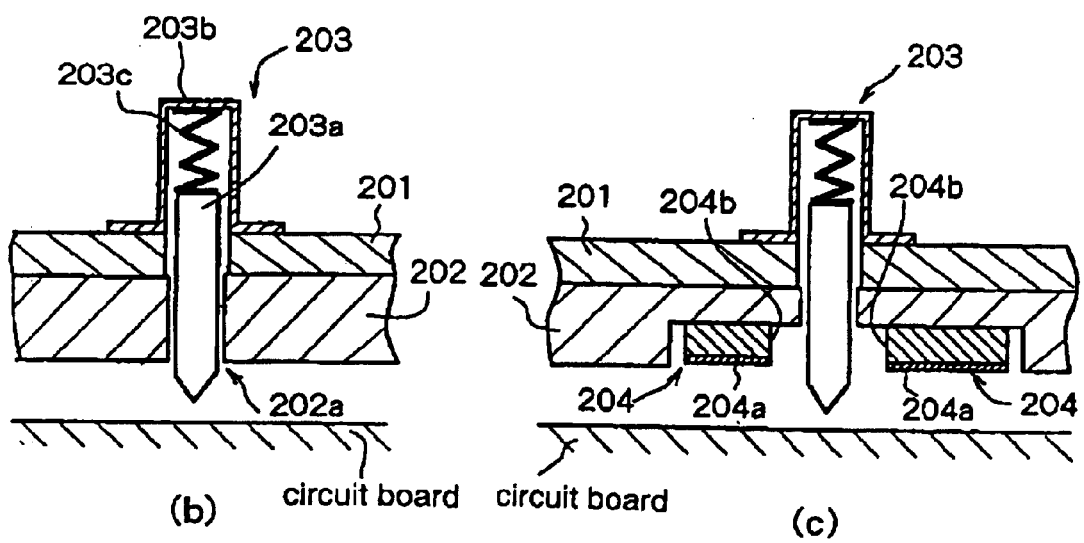
Figure 8:
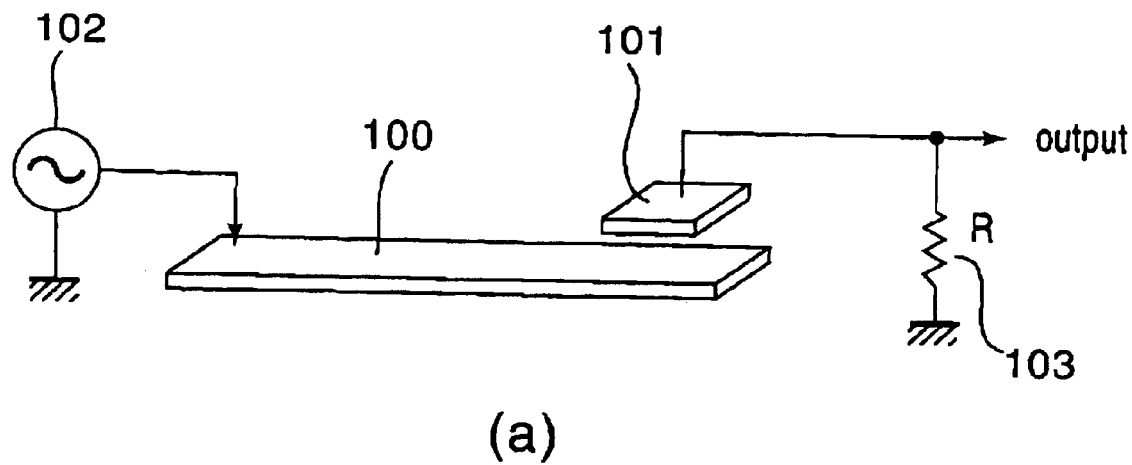
FIG. 8(a) illustrates a principle of an inspection based on capacitive coupling.
FIG. 8(b) illustrates an equivalent circuit of FIG. 8(a)
Figure 8:
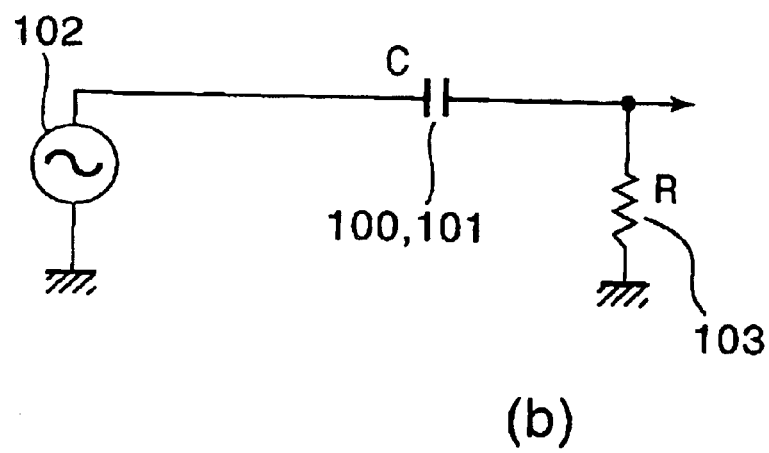
Figure 9:
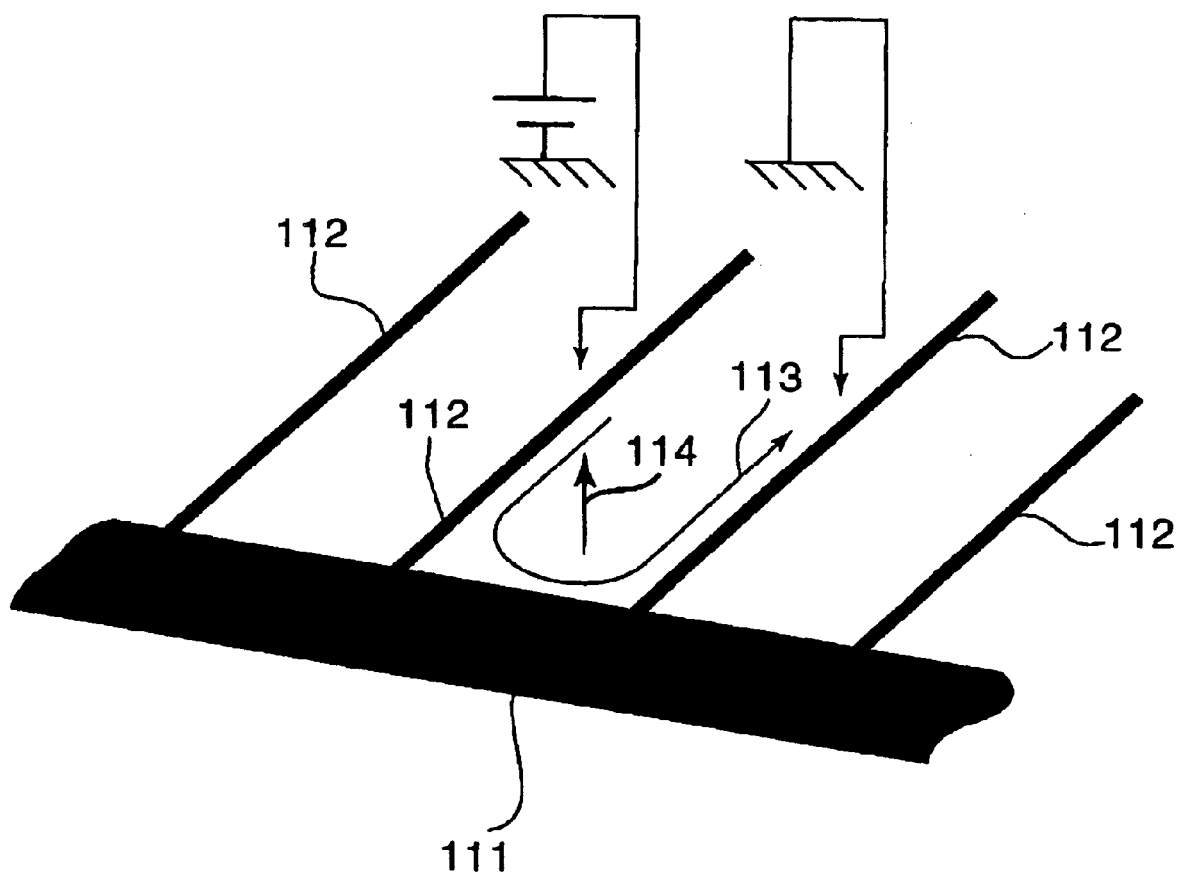
FIG. 9 illustrates a principle of an inspection based on detection of an electromagnetic field.
Figure 10:
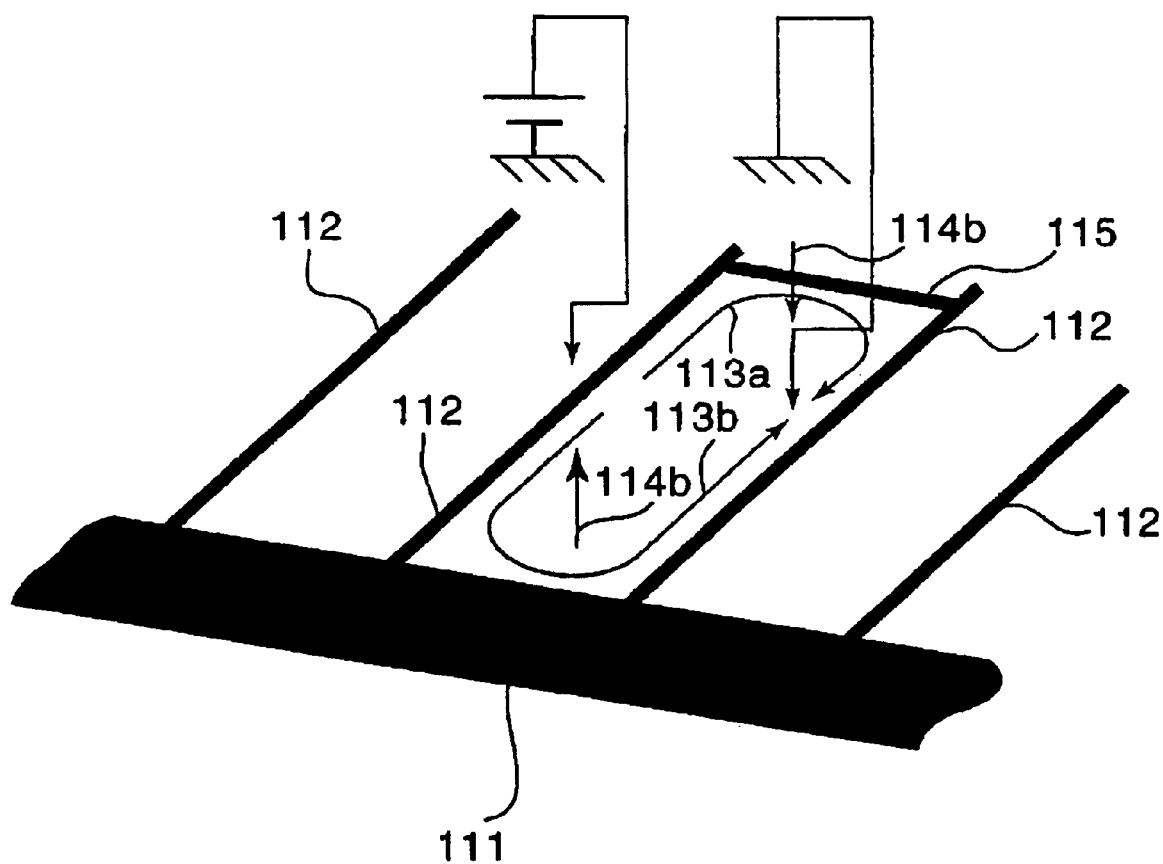
FIG. 10 illustrates the principle of the inspection based on detection of an electromagnetic field.

Preferred embodiments of the present invention will now be described. FIG. 1 is a sectional view of an inspection unit A according to one embodiment of the present invention, which corresponds to the sectional views of the conventional inspection unit 200 shown in FIGS. 7(b) and 7(c).

The inspection unit A comprises a probe portion 14 for the contact type inspection, an electrode 13 for the non-contact type inspection, a baseboard 11, and a board 12.

The probe portion 14 has the same structure as that of the conventional probe portion. That is, the probe portion 14 includes a probe body 14a, a sleeve 14b housing the rear end of the probe body 14a, and a spring 14c elastically biasing the probe body 14a in its axial direction to allow the front end of the probe body 14a to protrude from the surface of the board 12 (the surface having the electrode 13 formed thereon). Since the sleeve 14b is fixedly attached to the baseboard 11, the probe body 14a is supported by the baseboard 11 through the spring 14c and the sleeve 14b. Instead of the spring 14c, any other suitable elastic member such as rubber capable of biasing the probe body 14a in its axial direction may be used.

As with the conventional inspection unit 200, the probe body 14a is movable in its axial direction with being biased by the spring 14c, and the front end of the probe body 14a will be reliably brought into contact with a circuit wiring.

When connected to a signal source of an inspection signal, the probe body 14a acts to supply the inspection signal to a circuit wiring to be inspected. When connected to a measuring device of an inspection signal or the like, the probe body 14a acts to detect the inspection signal supplied to the circuit wiring. That is, the probe body 14a can be used not only to supply the inspection signal but also to detect it.

The board 12 is formed with a bore 12a which allows the probe body 14a to be penetratingly disposed therein and guides the axial movement of the probe body 14a. As with the bore 202a in the conventional inspection unit 200 described above, the bore 12a is intended to support the probe body 14a with preventing misalignment caused during the movement of the probe body 14a. In order to prevent the misalignment of the probe body 14a, the board 12 preferably has a thickness, for example, of 4 mm or more.

The material of the board may include, for example, plastic, resin, ceramic, glass or silicon which allows a conductive material to be formed thereon.

The electrode 13 is made by a conductive material such as copper, and is printed on the surface of the board 12. That is, in this embodiment, a printed board is defined by the board 12 and the electrode 13.

In this manner, the conventional problem is solved by printing the electrode 13 on the board 12 having the bore 12a adapted to prevent the misalignment of the probe body 14a.

More specifically, the electrode 13 formed directly on the board provides enhanced positioning accuracy between the probe body 14a and the electrode 13. In addition, the electrode 13 is formed without providing any hollowed portion in the board 12, and thereby the board 12 never gets thin around the bore 12a. Thus, the misalignment of the probe body 14a can be sufficiently prevented, and the probe body 14a can be arranged desirably closer to the electrode 13.

When connected to a signal source of an inspection signal, the electrode 13 acts to supply the inspection signal to a circuit wiring to be inspected. When connected to a measuring device of an inspection signal or the like, the electrode 13 acts to detect the inspection signal supplied to the circuit wiring, through capacitive coupling. That is, the electrode 13 can be used not only to supply the inspection signal but also to detect it, in non-contact with the circuit wiring.

Various modes of the inspection unit A will be described below.

Figure 5:
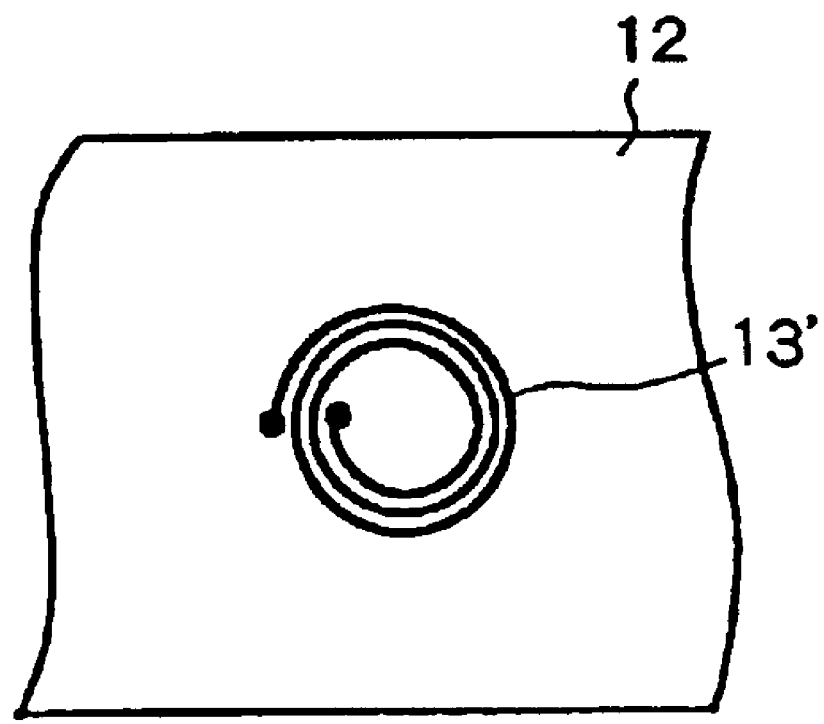
FIG. 5 illustrates an example in which the electrode 13 is formed in a spiral-shaped conductive pattern 13'.

As shown in FIG. 5, when the electrode 13 is printed on the surface of the board 12 in the form of a spiral-shaped pattern (13'), the electrode can act as a magnetometric sensor in the aforementioned inspection technique based on detection of an electromagnetic field.

Figure 11:
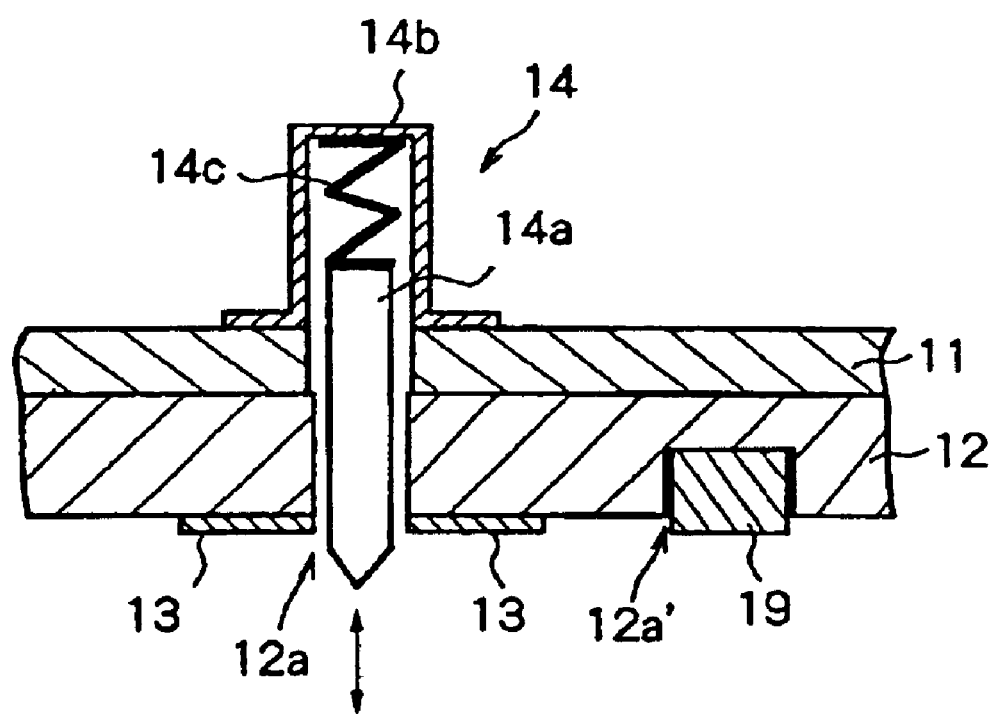
FIG. 11 is a sectional view of the inspection unit A provided with a magnetometric sensor 19.

Further, as shown in FIG. 11, a hole 12a' is provided in the surface of the board 12 (the surface on the side of the electrode 13), and a magnetometric sensor 19 is placed and mounted in the hole 12a'. The inspection unit of FIG. 11 itself can selectively carry out any one of the contact type inspection, the non-contact type inspection using the capacitive coupling, and the non-contact type inspection based on detection of an electromagnetic field, because it includes the probe portion 14, the electrode 13, and the magnetometric sensor 19. The magnetometric sensor 19 may include a coil or a hall element. Further, while the hole 12a' is formed as a hollowed portion in FIG. 11, it is understood that a hole penetrating the board 12 may also be used.

Figure 2:
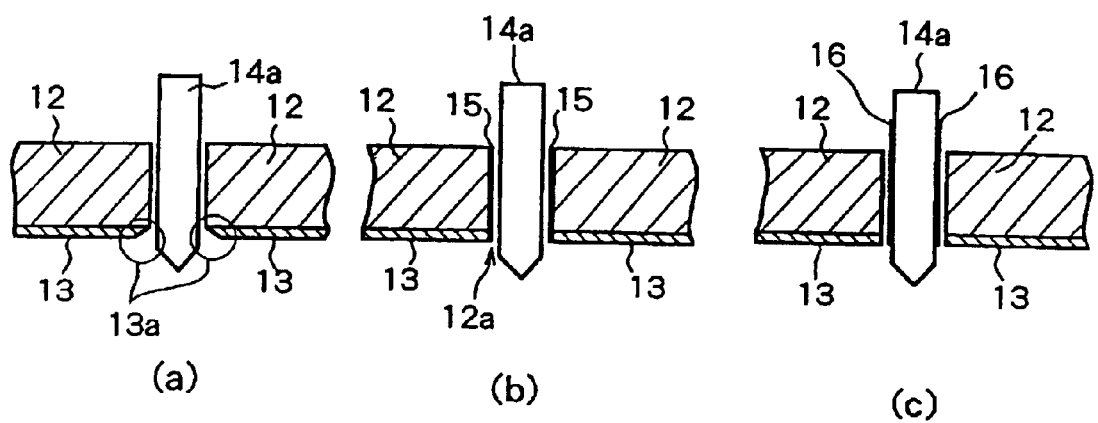
FIGS. 2(a) to 2(c) illustrate structures for preventing electrical short-circuit between a probe body 14a and an electrode 13, respectively.

When the probe body 14a and the electrode 13 are arranged extremely close to each other or the probe body 14a is arranged to penetrate the electrode 13, it is assumed that these are brought into contact with each other and are thereby electrically short-circuited. In this case, the portion 13a of the electrode 13 adjacent to the probe body 14a can be slightly shaved off as shown in FIG. 2(a). Alternatively, an insulating material 15 may be provided on the inner periphery of the bore 12a as shown in FIG. 2(b). Otherwise, an insulating material 16 may be provided on the outer periphery of the probe body 14a as shown in FIG. 2(c).

Figure 3:
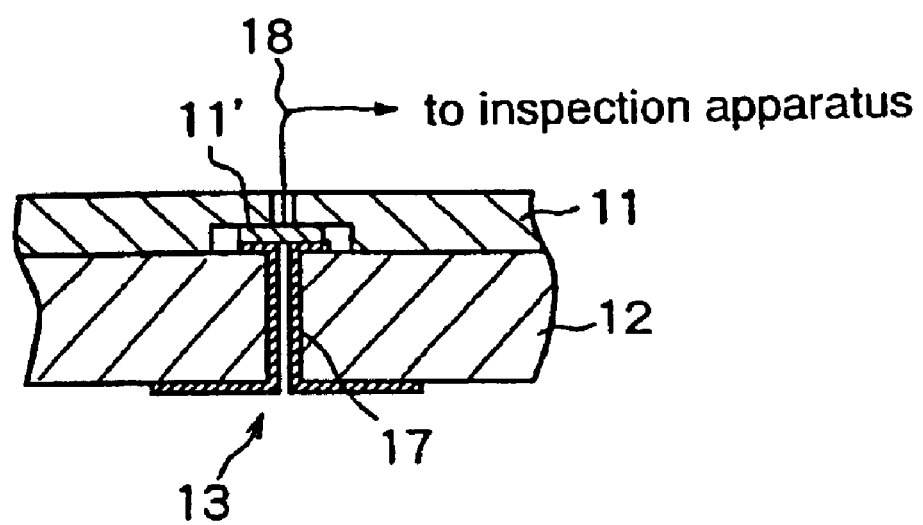
FIG. 3 is a sectional view showing a mode in which the inspection unit A includes a board 12 provided with a through-hole 17 connected to the electrode 13.

Further, in order to connect the electrode 13 to a signal source of an inspection signal or an inspection apparatus (not shown) such as a measuring device of a detected inspection signal, the board 12 may be provided with a through-hole connected to the electrode 13. FIG. 3 is a sectional view showing a mode in which the inspection unit A includes the board 12 provided with a through-hole 17 connected to the electrode 13.

The through-hole 17 penetrates the board 12. The through-hole 17 is connected to the electrode 13 on the side of one surface of the board 12, and is in contact with an electrode 11' provided in the baseboard 11 on the other surface of the board 12. Thus, the electrode 13 can be electrically connected to the inspection apparatus through a lead wire 18 connected with the electrode 11'.

Figure 4:
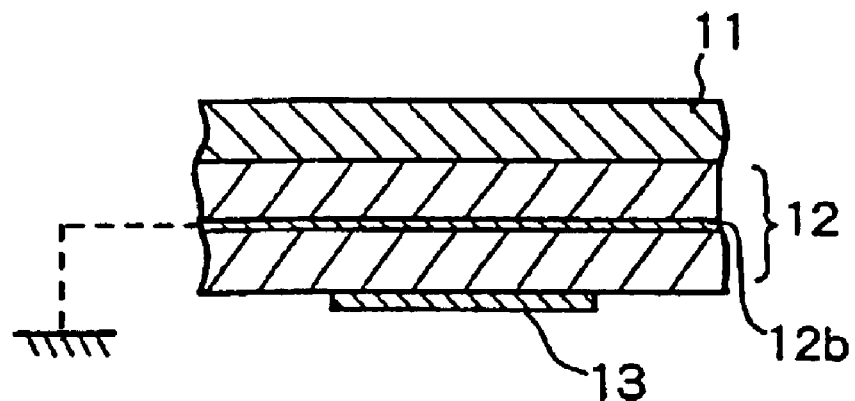
FIGS. 4(a) and 4(b) are sectional views of the inspection unit A having a structure for preventing noise.
Figure 4:
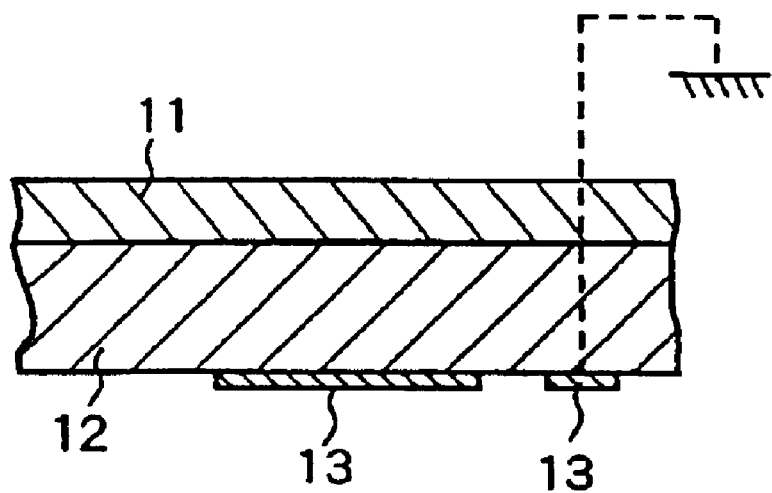

Further, the board 12 may be formed in a multi-layer board. FIG. 4(a) shows the board 12 formed in a multi-layer structure having a conductive layer 12b as its intermediate layer. This conductive layer 12b is connected to GND as shown by the illustrated dotted line. This effectively prevents undesirable noise caused when the supplied inspection signal to a circuit wiring to be inspected is detected. Alternatively, a portion of the electrode 13 may be connected to GND as shown by the dotted line in FIG. 4(b) to prevent the noise. In this case, other remaining portion of the electrode 13 will be electrically separated to each other on both sides of the electrode 13 connected to GND.

Figure 6:
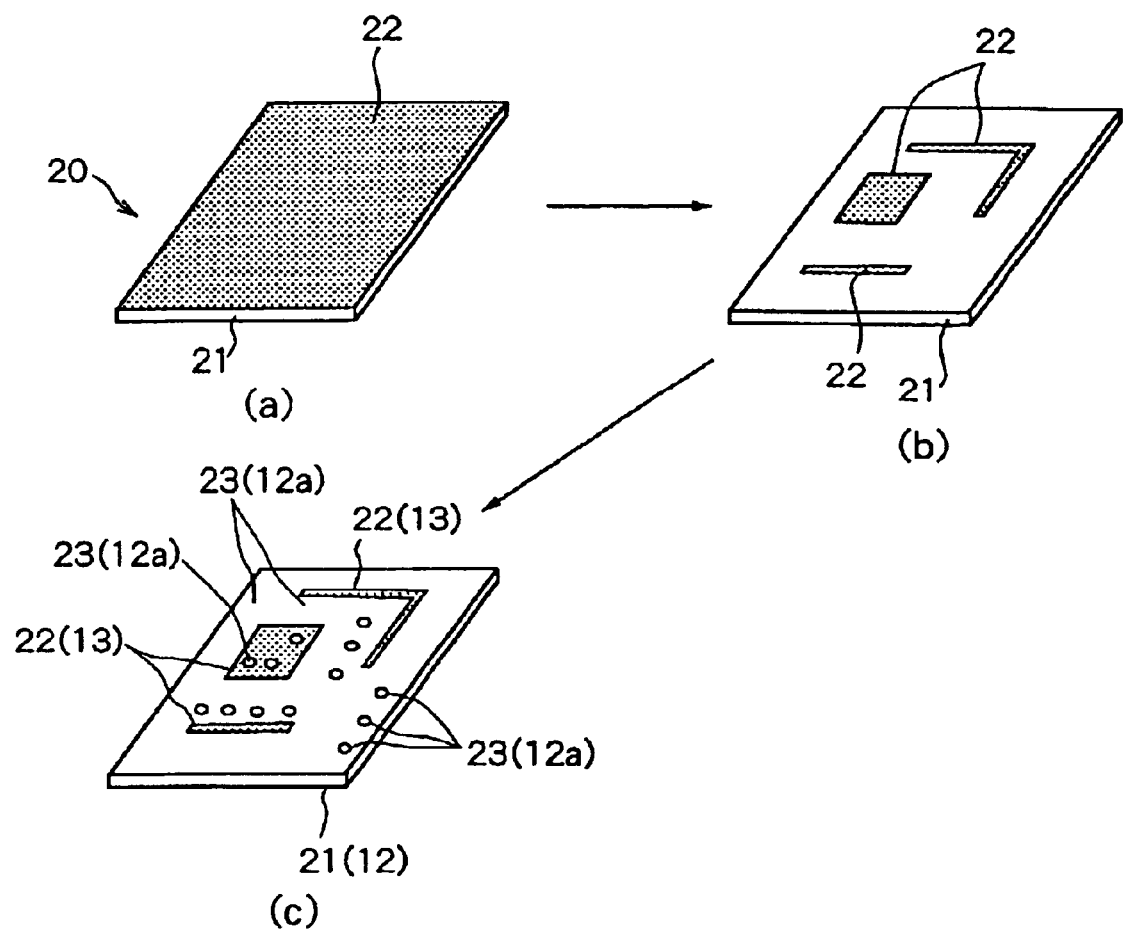

A method for manufacturing a printed board including the electrode 13 and the board 12 having the bore 12a will be described below. Any suitable conventional method for manufacturing a printed board may be used for this printed board. The following description will be made in conjunction with a method of manufacturing the printed board based on an etching process. FIG. 6 is an explanatory view of the process for manufacturing such a printed board.

The printed board is prepared from a primitive plate 20 composed of a plate substrate 21 on which a conductive material 22 such as copper is uniformly formed (FIG. 6(a)). The primitive plate 20 may include a copper clad laminate (CCL) using copper as the conductive material 22. The substrate 21 will be eventually made into the board 12 of the aforementioned inspection unit A.

Then, with leaving only a necessary part of the conductive material 22, other conductive material 22 is removed by etching (FIG. 6(b)). The remaining conductive material 22 defines the aforementioned electrode 13 or the printed electrode 13. The etching is applied to form the electrode 13 in conformity with the arrangement of a circuit wiring to be inspected.

Then, the etched primitive plate 20 is machined to form a bore 23 (FIG. 6(c)). This bore 23 serves as the aforementioned bore 12a for receiving the probe body 14a therethrough to prevent the misalignment of the probe body 14a. Thus, the bore 23 is formed in conformity with the arrangement of a circuit wiring to be inspected. By forming the bore 23 directly to the primitive plate 20 having the electrode 13, the positioning accuracy between the electrode 13 and the bore 12a can be enhanced. Preferably, the diameter of the bore 12a is designed to be larger than that of the probe body 14a to be received through the bore 12a, by about 100 micrometer.

The printed board is prepared through the above process. Subsequently, the baseboard 11 and the probe portion 14 will be incorporated into this printed board to provide the inspection unit A shown in FIG. 1.

It is understood that the spiral-shaped conductive pattern 13' may also be formed on the substrate 21 shown in FIG. 5 by etching, as a substitute for the electrode 13.

Further, when the structure shown in FIG. 11 is employed, the hole 12a' of the board 12 may be formed in parallel with, before or after the formation of the aforementioned bore 23. Further, while the bore 23 has been formed after etching of the conductive material 22 in the printed board manufacturing process shown in FIG. 6, it is understood that etching may be applied to the conductive material 22 after the bore 23 is formed in the primitive plate 20 of FIG. 6(a).

Further, while the etching process has been employed to form the electrode 13 in the printed board manufacturing process shown in FIG. 6, any other suitable technique may be employed. For example, an additive process may be employed in which a necessary conductive material (electrode) is printed on a board having no conductive material through a chemical vapor deposition process.

INDUSTRIAL APPLICABILITY

As described above, the present invention can allow a probe and other components to be positioned with a high degree of accuracy while preventing misalignment of the probe and to be arranged closer to each other.

What is claimed is:

1. An inspection unit for use in inspection of a circuit wiring, comprising:
   a probe for supplying an inspection signal in contact with said circuit wiring; and
   a board having an electrode printed thereon to perform non-contact detection of said inspection signal supplied to said circuit wiring;
   wherein said board includes a bore allowing said probe to be penetratingly disposed therein, said bore being adapted to guide the axial movement of said probe; and
   wherein said electrode is printed on said board to prevent misalignment between said probe and said board.

2. An inspection unit as defined in claim 1, wherein said board includes a through-hole connected to said electrode.

3. An inspection unit as defined in claim 1, wherein said board is a multi-layer board, wherein said multi-layer board includes a conductive layer to be connected to GND.

4. An inspection unit as defined in claim 1, wherein said board includes a conductive pattern printed thereon to be connected to GND.

5. An inspection unit as defined in claim 1, which further includes a base member for supporting said board and said probe, wherein said base member supports said probe through an elastic member biasing said probe in the axial direction of said probe.

6. An inspection unit as defined in claim 1, wherein the electrode performs non-contact detection through a capacitive coupling between the electrode and the circuit wiring.

7. An inspection unit for use in inspection of a circuit wiring, comprising:
   a probe for supplying or detecting an inspection signal in contact with said circuit wiring; and a board having an electrode printed thereon to perform non-contact supply or detection of an inspection signal to or from said circuit wiring;

wherein said board includes a bore allowing said probe to be penetratingly disposed therein, said bore being adapted to guide the axial movement of said probe; and wherein said electrode is printed on said board to prevent misalignment between said probe and said board.

8. An inspection unit for use in inspection of a circuit wiring, comprising:

a probe for supplying an inspection signal in contact with said circuit wiring; and a board having a spiral-shaped conductive pattern printed thereon to detect an electromagnetic field caused by said supplied inspection signal to said circuit wiring, wherein said board includes a bore allowing said probe to be penetratingly disposed therein, said bore being adapted to guide the axial movement of said probe.

9. An inspection unit for use in inspection of a circuit wiring, comprising:

a probe for supplying an inspection signal in contact with said circuit wiring;

a board having an electrode printed thereon to detect said supplied inspection signal to said circuit wiring in non-contact with said circuit wiring; and a magnetometric sensor provided on said board to detect an electromagnetic field caused by said supplied inspection signal to said circuit wiring;

wherein said board includes a bore allowing said probe to be penetratingly disposed therein, said bore being adapted to guide the axial movement of said probe; and wherein said electrode is printed on said board to prevent misalignment between said probe and said board.

10. An inspection unit as defined in claim 9, wherein said magnetometric sensor is disposed in a hole formed in said board.

11. An inspection unit for use in inspection of a circuit wiring, comprising:

a probe for supplying an inspection signal in contact with said circuit wiring; and a board having an electrode printed thereon to detect said supplied inspection signal to said circuit wiring in non-contact with said circuit wiring; and a base member supporting said board and said probe;

wherein said board includes a bore allowing said probe to be penetratingly disposed therein, said bore being adapted to guide the axial movement of said probe;

wherein said electrode is printed on said board to prevent misalignment between said probe and said board, and wherein said base member supports said probe through an elastic member biasing said probe in the axial direction of said probe.

* * * * *